United States Patent [19]
Pearce

[11] Patent Number: 5,341,135
[45] Date of Patent: Aug. 23, 1994

[54] ANALOGUE-TO-DIGITAL CONVERTERS, DIGITAL-TO-ANALOGUE CONVERTERS, AND DIGITAL MODULATORS

[75] Inventor: Timothy H. B. Pearce, Chelmsford, Great Britain

[73] Assignee: GEC-Marconi Limited, Middelsex, United Kingdom

[21] Appl. No.: 876,781

[22] Filed: Apr. 30, 1992

[30] Foreign Application Priority Data

May 3, 1991 [GB] United Kingdom ............... 9109637

[51] Int. Cl.⁵ .................................... H03M 1/10
[52] U.S. Cl. ..................... 341/120; 341/143
[58] Field of Search ................... 341/120, 143, 156

[56] References Cited

U.S. PATENT DOCUMENTS

| | | | |
|---|---|---|---|
| 4,862,169 | 8/1989 | van Bavel et al. | 341/143 |
| 4,943,807 | 7/1990 | Early et al. | 341/120 |
| 4,999,627 | 3/1991 | Agazzi | 341/131 |
| 5,124,703 | 6/1992 | Kaneaki et al. | 341/77 |
| 5,124,705 | 6/1992 | Voorman | 341/143 |
| 5,153,593 | 10/1992 | Walden et al. | 341/143 |

FOREIGN PATENT DOCUMENTS

| | | |
|---|---|---|
| 0308194 | 3/1989 | European Pat. Off. |
| 0328318 | 8/1989 | European Pat. Off. |
| 0368610 | 5/1990 | European Pat. Off. |
| 0463686 | 1/1992 | European Pat. Off. |
| 2202100 | 9/1988 | United Kingdom |

OTHER PUBLICATIONS

Electronics Letter, Feb. 14, 1991, vol. 27, No. 4, pp. 307–308, "IIR Filtering on Sigma–Delta Modulated Signals", D. A. Johns et al.
Proc. IEE, Nov. 11, 1973, vol. 120, No. 11, pp. 1379–1383, "Digital-Computer-Simulation Results of Multistage Delta-Modulation Systems", Dr. P. K. Chatterjee et al.
IEEE Transactions On Acoustics, Speech, And Signal Processing, Dec. 12, 1988, vol. 36, No. 12, pp. 1899–1905, "Oversampling A-to-D and D-to-A . . . Noise Shaping Modulators", Kuniharu Uchimura et al.
"A Use of Double Integration in Sigma Delta Modulation" Candy, IEEE Transactions on Communications, vol. COM-33 No. 1, Mar. 1st, 1985, pp. 249–258.

Primary Examiner—Marc S. Hoff
Attorney, Agent, or Firm—Spencer, Frank & Schneider

[57] ABSTRACT

An analog-to-digital converter includes a filter having an input for receiving, via a summing node, a signal derived from the analog input signal. A first quantizer produces a first digital signal from a signal derived from the output of the filter. A feedback loop feeds a signal derived from the first digital signal to be combined in analog form with the signal derived from the analog input signal at the summing node, so that the filter in use receives an error signal representing the difference between the signal derived from the analog input signal and the analog representation of the first digital signal. An error signal filter filters the error signal to remove noise outside the passband of the analog-to-digital converter. A second quantizer produces a second digital signal representative of the filtered error signal, and a combining circuitry combines the first and second digital signals to produce a digital output signal representative of the analog input signal.

9 Claims, 6 Drawing Sheets

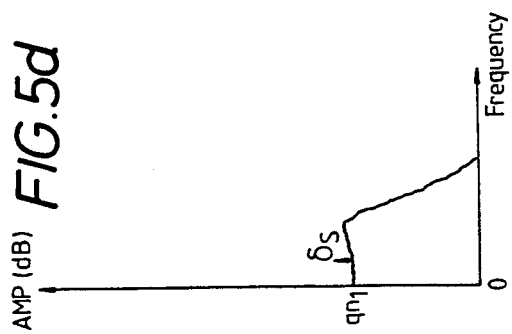
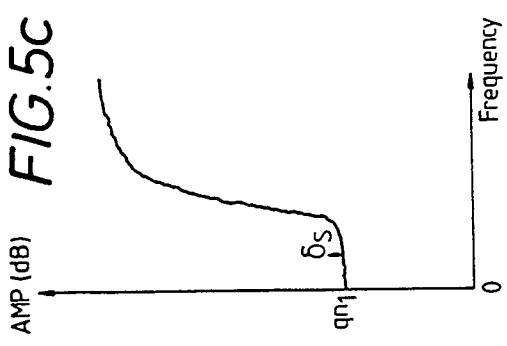
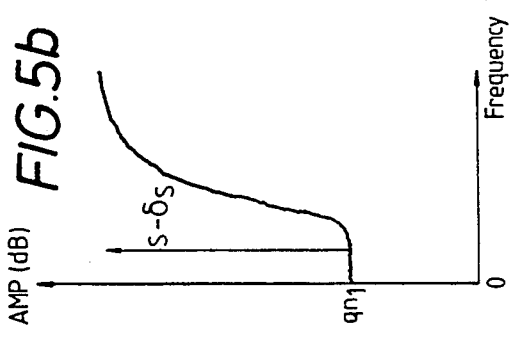
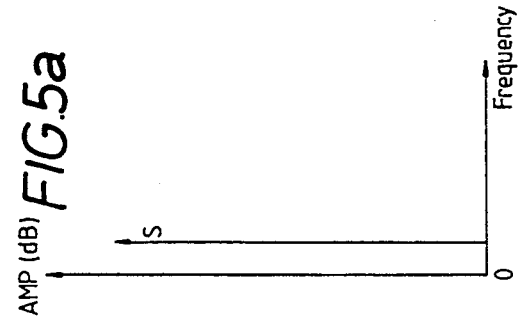
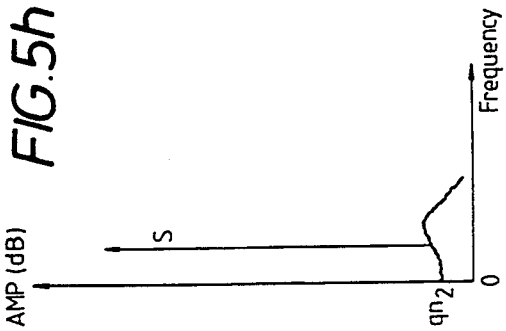
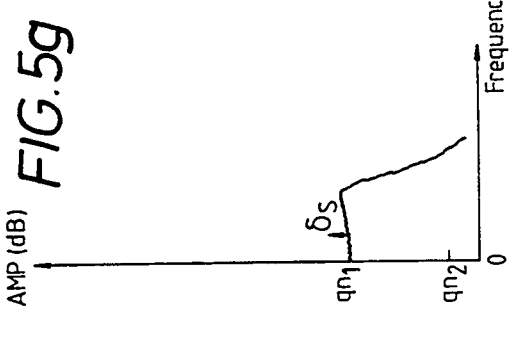
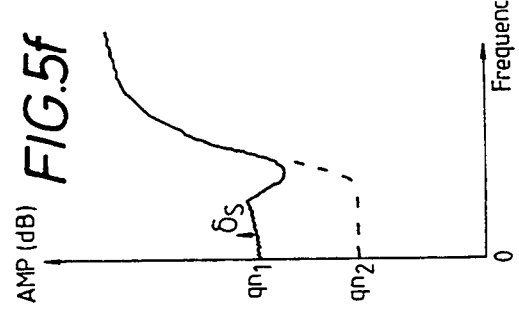
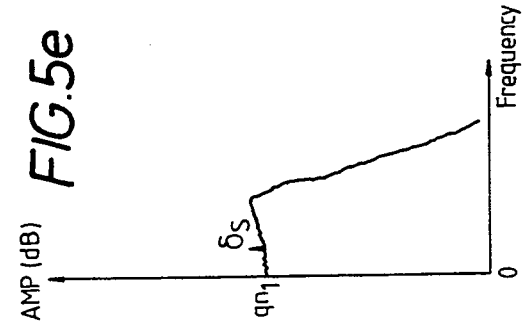

ANALOGUE-TO-DIGITAL CONVERTERS, DIGITAL-TO-ANALOGUE CONVERTERS, AND DIGITAL MODULATORS

BACKGROUND OF THE INVENTION

1. Field of the Invention

This invention relates to analog-to-digital (A-D) converters, digital-to-analog (D-A) converters, and digital modulators, especially to those employing sigma-delta converters.

2. Background Information

Sigma-delta A-D converters include quantizing means for producing a digital output, oversampled relative to the signal bandwidth, and a feedback loop for feeding back a signal derived from the digital output to be combined with the analog input for input to filter means, the output of the filter means being connected to the quantizing means. This permits an improved signal-to-noise ratio to be achieved from coarse quantization by shaping the quantizing noise spectrum to suppress it within a desired bandwidth. A following digital filter removes the out-of-band quantizing noise and also reduces the sampling rate to close to twice the signal passband.

The extent to which the quantizing noise is shaped in the signal passband depends upon the order of the loop filter within the sigma-delta A-D converter. Baseband converters using single bit quantization typically employ second or third order loop filtering and bandpass converters second order filtering. The use of higher order loop filters imposes greater demands to ensure loop stability.

MASH baseband converters have been proposed (EP-A-0,368,610, EP-A-0,328,318, and EP-A-0,308,194) to provide the reduced quantizatizing noise associated with higher order loop filtering without the disadvantages of susceptibility to oscillation, by the use of two or more first or second order sigma delta converters. In these arrangements, an error signal representing the difference between the input and the output of the quantizing means of a first sigma delta converter is itself converted to digital form in a second sigma delta converter and then subtracted from the digital output of the first sigma delta converter. This error signal contains an integration of the actual error between the input and output of the first sigma delta converter, requiring a digital differentiation of the output of the second sigma delta converter before it can be subtracted from the digital output of the first sigma delta converter.

Another proposal (GB-A-2,202,100) for reducing the quantization error, but related to A-D converters in general, entails a feedforward arrangement which combines the digital output of an analog-to-digital converter with an error signal, converted to digital form, and representative of the difference between the digital output reconverted to analog form and the analog input itself.

SUMMARY OF THE INVENTION

The invention provides an analog-to-digital converter, comprising filter means having an input for receiving, via a summing node, a signal derived from the analog input signal, first quantizing means for producing a first digital signal from a signal derived from the output of the filter means, a feedback loop for feeding a signal derived from the first digital signal to be combined in analog form with the signal derived from the analog input signal at the summing node, so that the filter means in use receives an error signal representing the difference between the signal derived from the analog input signal and the analog representation of the first digital signal, means for filtering the error signal to remove noise outside the passband of the analog-to-digital converter, second quantizing means for producing a second digital signal representative of the filtered error signal, and means for combining the first and second digital signals to produce a digital output signal representative of the analog input signal.

The combination of the first and second digital signals enables the contribution of the quantizing noise from the first quantizing means in the digital output to be reduced, while the effect of quantizing noise from the second quantizing means can be minimized because the full dynamic range of the second quantizing means can be used to encode the error signal. The analog-to-digital converter thus has improved signal-to-noise ratio. Unlike the MASH converters, the error signal encoded is the total error between the signal derived from the analog input signal and the analog representation of the first digital signal, including the residual error in the signal derived from the analog input signal and also any loop distortion, leaving only the error in the conversion of the first digital signal to analog form. In MASH converters, the error signal encoded represents only the quantizing error of the first quantizing means.

While the error signal in the converter of the invention may be extracted from the forward path from the summing node after the filter means (so that the filter means may also act as the error filter means), advantageously the error signal is extracted before the filter means, avoiding the need for the differentiation necessary in the MASH converters referred to. This makes it easier at least in the case of analog filter means to match the first and second digital signals across the passband to provide for accurate cancellation of errors in the first digital signal.

The second quantizing means may be selected so that its dynamic range matches the filtered error signal, but advantageously an amplifier is provided for amplifying the error signal either before or preferably after filtering by the error filter means, so that the second quantizing means can have the same operating level and dynamic range as the first quantizing means, which is of course matched to the analog input. The first quantizing means may form part of a first sigma-delta analog-to-digital converter, and the second quantizing means may form an identical sigma-delta analog-to-digital converter.

Advantageously, to accomplish the matching of the first and second digital signals, an equalization network is provided for offsetting phase and amplitude errors introduced by the error filter means and the second quantizing means and before the first and second digital signals are combined. The equalization network may be calibrated by means of a test signal, which may be applied in place of the output of the first quantizing means with the analog input signal being set to zero. The calibration may be carried out at repeated intervals to take account of component drift, to provide increased accuracy of cancellation of errors.

The analog-to-digital converter may be either baseband or bandpass.

Advantageously, a digital filter precedes the combining means and arranged to remove out of band quantizing noise and to provide an output at a lower sampling rate.

The filter means may be first, second, third or higher order, but bandpass converters will usually be of a lower order than baseband converters. The filter means may be analog, in which case the feedback loop feeds back an analog signal derived from the first digital signal to the input of the filter means. A digital-to-analog converter may be provided in the feedback loop for this purpose. The quantizing means may be single bit or multi-bit.

The invention also provides a digital-to-analog converter, comprising filter means having an input for receiving, via a summing node, a signal derived from the digital input signal, first quantizing means for producing a first digital signal from a signal derived from the output of the filter means, a feedback loop for feeding a signal derived from the first digital signal to the summing node, so that the filter means in use receives an error signal representing the difference between the signal derived from the digital input signal and the feedback signal, means for filtering the error signal to remove noise outside the passband of the digital-to-analog converter, second quantizing means for producing a second digital signal representative of the filtered error signal, first and second digital-to-analog converters for producing first and second analog signals representative of the first and second digital signals, respectively, and means for combining the first and second analog signals to produce an analog output signal representative of the digital input signal.

The invention also provides a digital modulator, comprising filter means having an input for receiving, via a summing node, a signal derived from a multi-bit digital input signal, first quantizing means for producing a first digital signal with a lesser number of bits from a signal derived from the output of the filter means, a feedback loop for feeding a signal derived from the first digital signal to the summing node, so that the filter means in use receives an error signal representing the difference between the signal derived from the digital input signal and the feedback signal, means for filtering the error signal to remove noise outside the passband of the digital modulator, and second quantizing means for producing a second digital signal with a lesser number of bits than the multi-bit digital input signal, representative of the filtered error signal.

BRIEF DESCRIPTION OF THE DRAWINGS

The invention will now be described, by way of example, with reference to the accompanying drawings, in which:

FIGS. 5a to 5h show the frequency response in dB at points a to h in FIGS. 1 and 2 to a single tone input.

DETAILED DESCRIPTION OF THE PREFERRED EMBODIMENT

Figure 1:
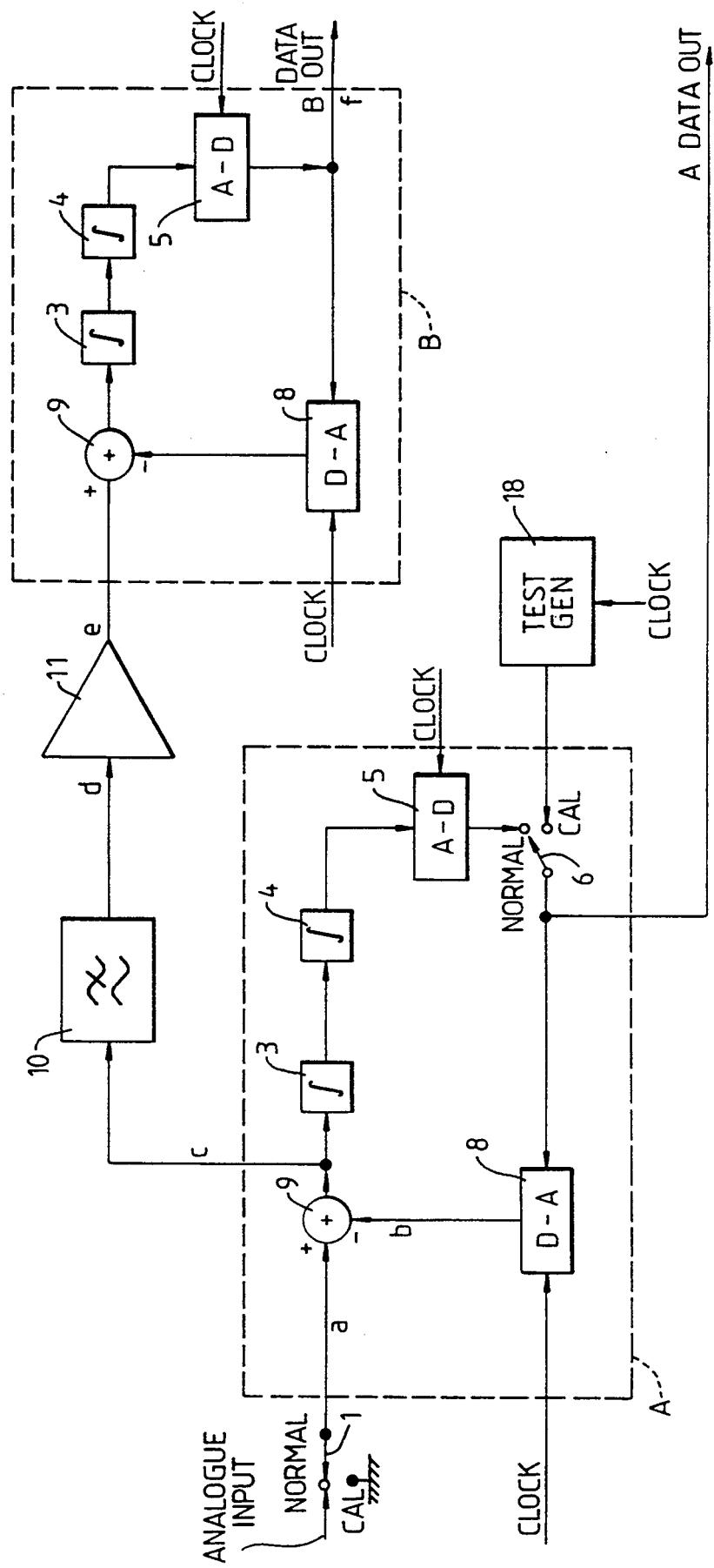
FIG. 1 is a block diagram of a first two-stage analog-to-digital converter for baseband signals.

Referring to FIG. 1, the first baseband analog-to-digital converter comprises two identical sigma-delta converters A and B. The analog input to the first converter is fed to a two position switch 1 which in one position (normal) feeds the input of sigma-delta converter A.

Sigma-delta converter A, like sigma-delta converter B is of known form (e.g. IEEE Transactions of Communications Vol. Comm. No. 3, March 1985 pp 249–257) and comprises a two stage analog filter means implemented by integrators 3, 4, which as is well known have a low pass characteristic. The following description refers to sigma-delta converter A, but the same applies also to sigma-delta converter B, which differs only in not having a switch at the output of the quantizer 5, so like reference numerals have been used for like parts for both converters A and B. The output of the integrator 4 is connected to the input of a first quantizing means, which is in the form of a single bit analog-to-digital (A-D) quantizer 5 sampled at the rate of typically 100 times the roll-off of the low pass filters. This first digital signal is fed to a second switch 6 which in one position (normal) feeds the signal around a feedback loop which includes single bit digital-to-analog (D-A) converter 8, which is clocked at the same rate as A-D converter 5. The data output (first digital signal) from the sigma-delta converter A is taken from the commencement of the feedback loop and represents the usual digital output of a sigma-delta converter which the present invention is attempting to enhance. The signal, reconverted to analog form, from D-A converter 8, is subtracted from the analog input in subtractor 9, so that the integrators 3, 4 receive a signal representing the difference between the analog input signal and the feedback signal, which itself contains a component which strives to follow the input signal. If imperfections in D-A converter 8 are ignored, the signal fed into the integrators represents the difference between the analog signal (e.g. a single tone s in the converter passband) and the analog version of the digital output signal, and hence can be regarded as an error signal. One component of the error signal ($q_{n1}$) stems from quantization noise at the A-D converter 5, while the other component $\delta s$ represents the difference between the input signal and the component of the input in the digital-to-analog converter 8 output. The feedback loop has the effect of shaping the quantization noise characteristic to reduce it significantly in the filter passband.

In accordance with the invention, the second sigma-delta converter B acts as a second quantizing means and produces a digital output from the output of A-D converter 5 (the second digital signal) representative of the error signal after filtering in error filter 10 and amplification in error amplifier 11. This second digital signal is combined with the first digital signal to produce a digital output from the baseband converter with improved signal-to-noise ratio. The error signal is band limited to the pass band of the first sigma-delta converter A (also of the composite converter) by low pass analog error filter 10 and amplified by error amplifier 11 by approximately the amount by which the component of the error signal that is related to the analog input is amplified by the loop gain of the sigma-delta converter A. Sigma-delta converter B operates in the same way as sigma-delta converter A.

Thus, referring to FIGS. 5a to 5h, which show the amplitudes present at various points a-h in the analog-to-digital converter (exaggerated for the sake of clarity), in response to an analog input of a single tone s. FIG. 5a shows the tone at the input of the sigma-delta converter A. FIG. 5b shows the feedback signal applied to the negative input of subtractor 9. The tone has been reduced by an amount δs and the characteristic shaped noise of the sigma-delta converter is produced. In the passband, the noise is at a minimum $q_{n1}$. The error signal, shown in FIG. 5c, has two components, namely, δs related to the analog input, and $q_{n1}$ representing the noise. After removing out-of-band noise in error filter 10, the signal is as shown in FIG. 5d. If this signal was applied to second sigma-delta converter B, it would be submerged in the noise floor $q_{n2}$, and so it is first amplified in amplifier 11 (FIG. 5e). This amplified and filtered error signal appears in the passband of the characteristic noise shape of sigma-delta converter B, the frequency characteristic of the data output of B (the second digital signal) being shown in FIG. 5f. The characteristic has the same noise floor $q_n$ in the passband, (shown dotted and denoted by $q_{n2}$). Since imperfections in digital-to-analog converter 8 have been ignored, the signal contained in data output A (the first digital signal) and appearing at the output of the delay 15 is the same as that at point b and as shown in FIG. 5b.

Out-of-band noise is filtered from data output B in decimating filter 12, and in the equalizing means described below, the data output B is attenuated by the amount by which the error signal was amplified in amplifier 11. Thus, the signal appearing at point g as one input to adder 16 has the frequency response shown in FIG. 5g, and the signal is as similar as possible to the filtered error signal (FIG. 5d). The other input to adder 16 is the feedback signal (FIG. 5b) as explained. At the output of the adder 16 (FIG. 5h), the amplitude of the tone s is restored to its correct value (s-δs+δs), and the quantization noise $q_{n1}$ is reduced within the limits of the accuracy of the combining means. This leaves quantization noise $q_{n2}$, but this has been reduced in inverse relation to the gain of the amplifier 11 and hence the noise floor of the combined digital output is considerably reduced. Thus, the two stage analog-to-digital converter of the invention has improved signal-to-noise ratio.

Of course any imperfections in digital-to-analog converter 8 of sigma-delta converter A will impair this improvement, and it is thus important that this component is as linear as possible. One way of achieving this is to implement it as a single bit D-A converter. The digital-to-analog converter of sigma-delta converter B also needs to be linear but is not as critical as A.

The first and second digital signals pass through decimating filters 12, 13 which are clocked at their outputs with a much lower rate than the clock for sigma-delta converters A and B, in fact at approximately twice the rate of the filter passband. The outputs of the decimating filters are typically 24 bits in parallel.

The output of filter 12 through which the output of the sigma-delta converter B is passed is fed through an adaptive N Tap FIR (finite impulse response) equalizer 14. The output of filter 13 through which the error signal quantized by sigma-delta converter A is passed, is delayed by delay 15 of N/2 samples equal in duration to the mean delay in the N-tap filter and then added in adder 16 to the quantized filter output to provide the output of the composite converter. The digitized error signal is passed through the equalized rather than the delay since the former needs least dynamic range.

The purpose of the equalizer 14 is to compensate for amplitude and phase differences between the following signal paths (path X—sigma-delta converter A digital output through D-A converter 8, subtractor 9, analog error filter 10, error amplifier 11, analog input to digital output of sigma-delta converter B, and sigma-delta converter B decimating filter 12; path Y—sigma-delta converter A digital output and sigma-delta converter A decimating filter 13). The degree of matching to achieve a satisfactory cancellation is very stringent. For 40 dB cancellation, the amplitude needs to be matched to better than 0.1 dB and the phase to less than 0.7 degrees across the signal passband.

In order to calibrate the equalizer, a test signal generator 18 is provided. The switches 1 and 6 are set to the position marked CAL, so that the input of the sigma-delta converter A is set to zero and the input of the digital-to-analog converter 8 of the sigma-delta converter A is connected to the test generator, the feedback loop being opened at this point. The digital test signal consists of a single bit data sequence providing a set of tones spaced at equal intervals across the signal passband, and a set of M samples are taken simultaneously from the output of the decimating filters 12, 13 (paths X, Y), and stored. M is normally greater than N by a factor of at least 16. An FFT (Fast Fourier Transform) is taken on the M samples from path X and on the M samples from path Y and the results are stored. The FFT results for path Y are then divided by the FFT result for path X, point by point in the frequency domain, to yield a set of complex frequency samples of the response of an equalizer which would compensate for the gain and phase differences between the two paths, and an inverse FFT on these frequency samples yields the complex tap weights for the FIR equalizer, which are then updated accordingly, the computation being carried out in block 17.

Ideally the equalizer should compensate for the entire half sample rate passband of the output of the two decimation filters. In practice, it is unlikely that this will be necessary over more than about 80% of the passband of the decimation filters. There then exists the opportunity for tailoring the end taps of the equalizer to optimise the equalizer response over the central 80% of the band.

The calibration is carried out frequently, typically say, every few seconds, depending on the rate of component drift, and in practice the switches can revert to normal position as soon as the M test samples have been stored. The functions beyond the decimating filters may be carried out by means of programmable digital signal processors (DSP).

Typical operational values for the two stage baseband sigma-delta converter are as follows: bandwidth of composite converter and of filters 3, 4, 100 KHz; clock frequency of A-D converter 5 and D-A converter 8, 10 MHz; output clock frequency of decimation filters 12, 13, 200 KHz; frequency range of error filter 10, D.C. to 100 KHz; number of taps of FIR equalizer, 16, and sampling frequency, 200 KHz, and number of tones in test signal, 16.

Figure 3:
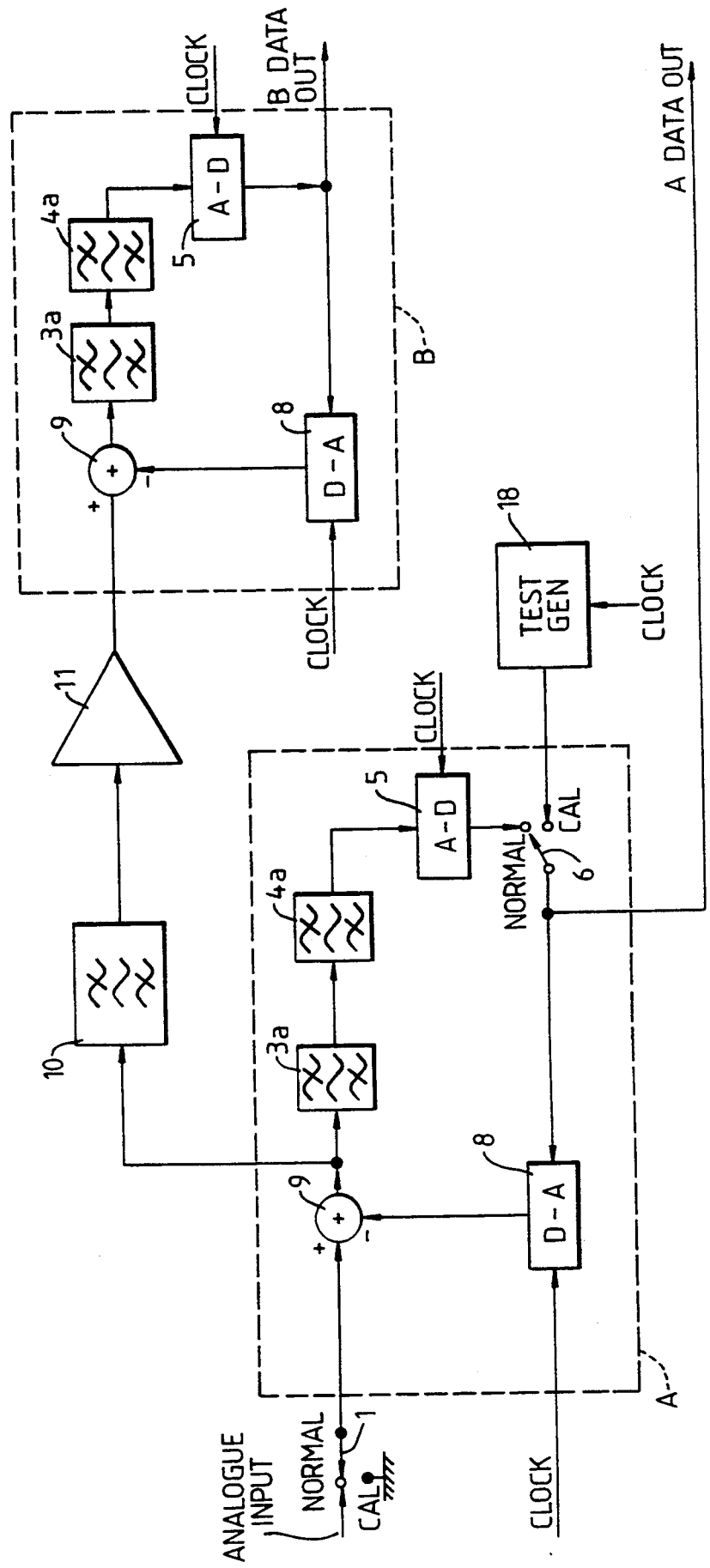
FIG. 3 is a block diagram of a second two-stage analog-to-digital converter for bandpass signals.
Figure 4:
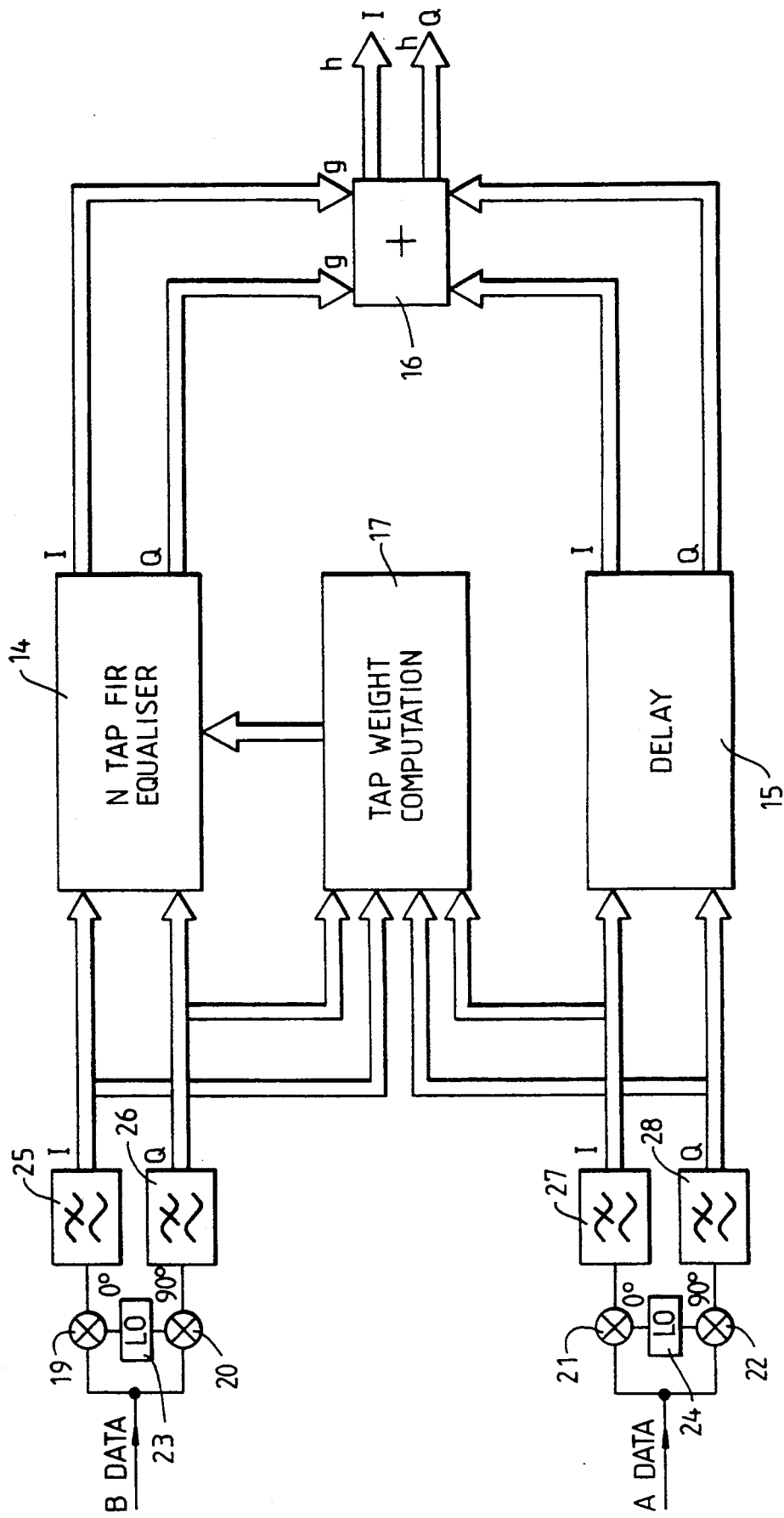
FIG. 4 is a block diagram of a digital signal processing stage for the bandpass filter of FIG. 3.

The bandpass converter shown in FIGS. 3 and 4 is similar to the baseband converter referred to above and hence will not be described in detail. Like reference numerals have been given to like parts. The filter means is implemented by filters 3a, 4a instead of integrators 3, 4. The bandpass filters 3a, 4a, may employ inductors and capacitors. The bandpass sigma-delta converters may be as in GB-A-2 232 023.

In this version sigma-delta analog-to-digital converters A and B provide a quantization noise spectrum with a null around one quarter the sampling frequency with the loop filters providing a bandpass response around this frequency. Thus, the forms of the frequency response will differ from those shown in FIGS. 5a–5h only in that the left-hand side of the response will be symmetrical with the right-hand side, and the zero frequency points of FIGS. 5a–5h will correspond to the input signal center frequency equal to one quarter the sampling frequency, but the notch width will remain the same.

The output of each bandpass sigma-delta converter A, B (bandwidth b) is first mixed to baseband I and Q by quadrature mixing within mixers 19–22 with digital local oscillator signals provided by local oscillators 23, 24. These I and Q signals are then each low pass filtered in decimating filters 25–28 to half the bandwidth of the bandpass converters (b/2) and the sampling rate reduced to be commensurate with twice this bandwidth.

Equalization for the amplitude and phase response of the error signal path is provided in the same manner as in the baseband converter except that the equalizer and delay inputs are now complex I and Q signals, to permit independent control of the frequency and phase response either side of the input signal center frequency. Similarly the combination of the equalizer and delay outputs remain in complex I, Q format to provide the overall baseband I, Q output signal.

While perfect cancellation can be achieved at N frequencies equally spaced across the decimation filter bandwidth with an N tap equalizer, the degree of equalization and hence cancellation which can be achieved at frequencies between these N points will depend upon the smoothness of the passband amplitude and phase response of the error filter 10, and of the number of taps in the equalizer. For a practical error filter, practical programmable digital signal processor, and decimating filter output sample rate of 100 KHz, a 16 tap equalizer can be implemented to give at least 40 dB cancellation over 80 KHz bandwidth. Typical operational values for the bandpass converter for an analog input of 100 KHz bandwidth centered around 2.5 MHz and output I and Q channels of twenty-four bits in parallel clocked at 100 KHz are sampling rate for quantizer 5, 10 MHz; frequency range of error filter 10, 2.5 MHz+50 KHz; clock frequency of decimating filters 25–28, 100 KHz.

Of course variations may be made to the above embodiments without departing from the scope of the invention. Thus, although the A-D converters 5 and D-A converters 8 have been described as being single bit, they could if desired be multi-bit. If desired, the amplifier 11 could be incorporated in sigma-delta converter B, so that the dynamic range and operating level of sigma-delta converter B matches that of the unamplified error signal. Further, the error signal could be extracted after instead of before the filter means 3, 4, 3a, 4a in the forward path from the summing node 9, and the filter means 3, 4, 3a, 4a could perform the function of the error filter 10, enabling the latter to be omitted. However, it would then be necessary to compensate for the response of the filter means e.g. in the case of the integrators 3, 4 of the baseband converter, by differentiating the error signal before feeding it to sigma-delta converter B. Finally, instead of filter means 3, 4, 3a, 4a being analog, the invention is also applicable to the situation where an analog input is sampled, and sampled data analog filter means 3, 4, 3a, 4a are used.

Figure 6:
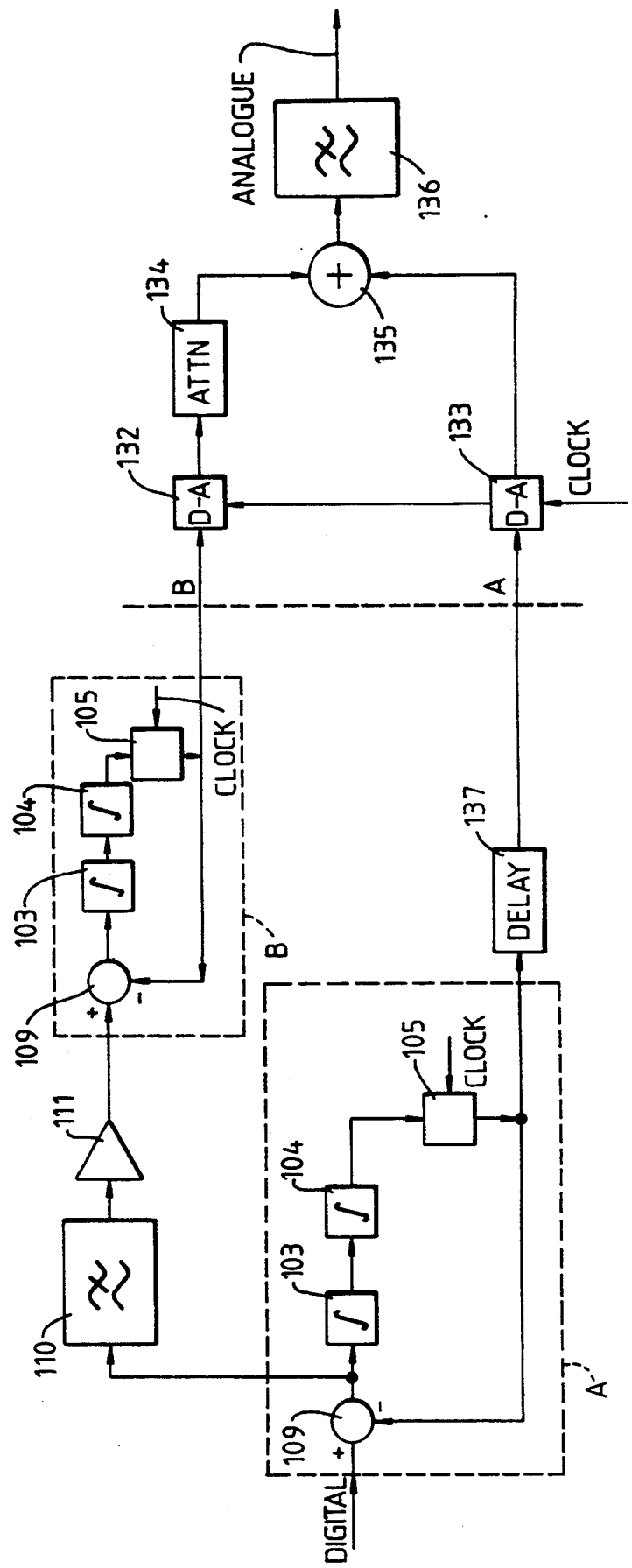
FIG. 6 is a block diagram of a two-stage digital-to-analog converter for baseband signals.

Referring to FIG. 6, a digital-to-analog converter is based on the analog-to-digital converters referred to above. The converter is two-stage, and employs identical sigma-delta converters A and B, which are similar to sigma-delta converters A and B of FIG. 1, except that: integrators 103, 104 are digital whereas integrators 3, 4 are analog; 105 is a quantizer with a digital input whereas quantizer 5 has an analog input; digital-to-analog converter 8 is omitted; and subtractor 109 operates upon digital signals whereas subtractor 9 operates on analog signals. Test generator 18 and switches 1 and 6 are not required.

The input to the two-stage converter is multi-bit, and sigma-delta converters A and B, in particular quantizers 105, are single bit, so that data output signals A and B are also single bit. If desired, quantizers 105 could have more than one bit, provided the number of bits is less than that in the multi-bit input.

Figure 2:
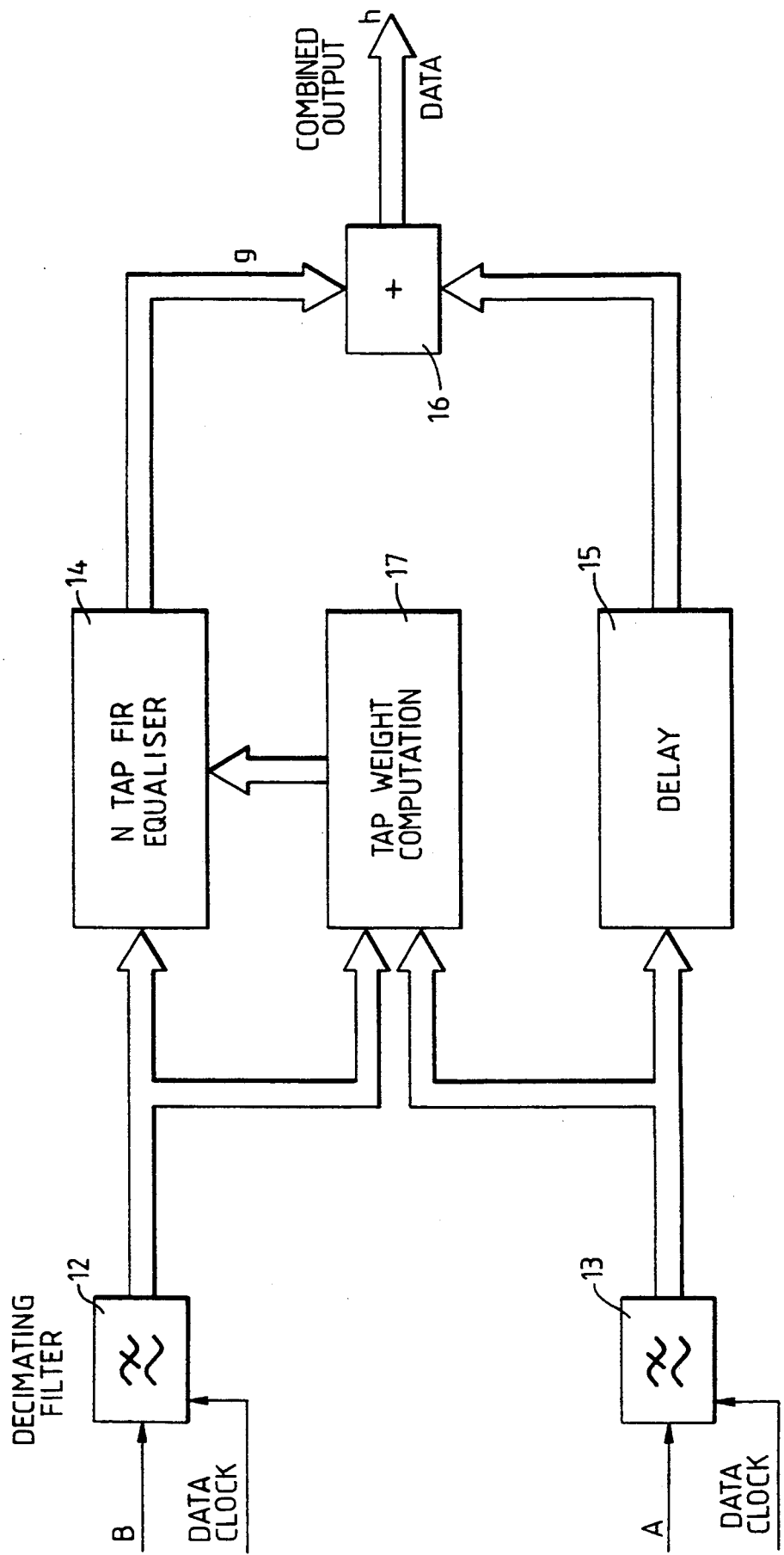
FIG. 2 is a block diagram of a digital signal processing stage for the baseband converter of FIG. 1.

In a similar manner to the embodiment of FIGS. 1 and 2, the input to the integrators 103, 104 represents the error between the single bit output of the quantizer 105 and the multi-bit input, and consists of a component related to the multi-bit input and a quantizing noise component.

This error signal is filtered to remove out of band noise in a digital linear phase finite impulse response (F.I.R) filter 110, and then amplified in digital amplifier 111 to match the dynamic range of sigma-delta converter B. The output of sigma-delta converter B is a second digital output representative of the error signal, while the output of sigma-delta converter A is a first digital signal representative of the multi-bit digital input.

The first digital signal A is passed through a delay 137 equal to the delay of error filter 110, amplifier 111 and input to output of sigma-delta converter B. These signals are then applied, respectively, to the inputs of digital-to-analog converters 132, 133, which are clocked at the same rate as data signal A, and clocked in phase with each other. The converters 132, 133 have amplitude gains matched to that of each other.

The analog outputs of digital-to-analog converters 132, 133 are added in adder 135 after the output of converter 132 is attenuated by an amount equal to the combined gain of error filter 110 and amplifier 111 in attenuator 134. The composite output from adder 135 is filtered in filter 136 to remove out-of-band noise components.

The degree of suppression of the quantization noise in the signal from digital-to-analog converter 133 by the signal from digital-to-analog converter 132, is dependent upon the amplitude and phase matching of the two digital-to-analog converters 132, 133. In practice, this can be maintained at 0.1 dB amplitude and approximately 0.7 degrees phase to ensure 40 dB suppression of quantizing noise i.e. 40 dB improvement in signal-to-noise ratio over that of a single sigma-delta converter.

Although FIG. 6 illustrates a baseband digital-to-analog converter similar to the analog-to-digital converter of FIGS. 1 and 2, the digital-to-analog converter may be bandpass and similar to the analog-to-digital converter of FIGS. 3 and 4. In the baseband case, a digital input could typically be twenty-four bits in parallel each stream being clocked at 200 KHz. An interpolation filter (not shown) could interpolate samples so that the input to the digital-to-analog converter would be twenty-four bits in parallel clocked at 10 MHz. Quantizers 105 could then be single bit quantizers clocked at 10 MHz. The output would be an analog signal of bandwidth 100 KHz. In the band pass case, two interpolation filters would be provided to convert I and Q input digital signals of twenty-four bits, each stream being clocked at 100 KHz, to I and Q signals of twenty-four bits clocked at 10 MHz. These are then mixed with digital quadrature local oscillator signals to center the signal around 2.5 MHz, and combined. The combined signal forms the input to the digital-to-analog converter in which the quantizers 105 are clocked at 10 MHz. The output is an analog signal of bandwidth 100 KHz centered around 2.5 MHz.

If desired, the final digital-to-analog converters could be omitted to provide a digital modulator for converting a multi-bit input signal to two output signals A, B, which may be combined in digital form, of one bit (or more than one bit but less than the number of bits in the multi-bit input signal).

I claim:

1. An analog-to-digital converter comprising:
   an input for analog signals;
   filter means having an input for receiving, from a summing node, an error signal;
   first quantizing means for producing a first digital signal from a signal derived from the output of the filter means;
   a feedback loop for feeding a signal derived from the first digital signal to be combined in analog form with a signal derived from the analog input signal at the summing node, so that the filter means in use receives the error signal representing the total error between the signal derived from the analog input signal and the analog representation of the first digital signal;
   means for filtering the error signal to remove noise outside the passband of the analog-to-digital converter;
   second quantizing means for producing a second digital signal representative of the filtered error signal;
   means for combining the first and second digital signals to produce a digital output signal representative of the analog input signal;
   an equalization network for offsetting phase and amplitude errors introduced by the filtering means and by the second quantizing means before the first and second digital signals are combined; and
   means for calibrating the equalization network by means of a test signal at intervals of time.

2. An analog-to-digital converter as claimed in claim 1, wherein the test signal is applied in use in place of the output of the first quantizing means with the analog input signal being set to zero and the feedback loop being broken.

3. An analog to digital converter as claimed in claim 2, wherein the phase and amplitude errors are measured in use immediately before the combining means.

4. An analog-to-digital converter as claimed in claim 1, wherein the first quantizing means forms part of a sigma-delta converter, and the second quantizing means is formed by an identical sigma-delta converter.

5. An analog-to-digital converter as claimed in claim 1, wherein the output of the error filter means is connected to an amplifier, the output of the amplifier being connected to the second quantizing means.

6. An analog-to-digital converter as claimed in claim 1, wherein the filter means has a low pass characteristic.

7. An analog-to-digital converter as claimed in claim 6, wherein the filter means includes an integrator in at least one stage of the filter means.

8. An analog-to-digital converter as claimed in claim 1, wherein the filter means has a bandpass characteristic.

9. An analog-to-digital converter as claimed in claim 8, including means for mixing the first and second digital signal with quadrature local oscillator signals to provide baseband I and Q signals.

* * * * *